United States Patent [19]

Levinson

[11] Patent Number: 4,999,576
[45] Date of Patent: Mar. 12, 1991

[54] ELECTRICAL-ENERGY-SUPPLYING DEVICE HAVING AN EXTENDED STORAGE LIFE

[75] Inventor: Lionel M. Levinson, Schenectady, N.Y.

[73] Assignee: General Electric Company, Schenectady, N.Y.

[21] Appl. No.: 387,183

[22] Filed: Jul. 31, 1989

[51] Int. Cl.$^5$ .................. G01R 21/06; H02J 9/00; H01M 10/50
[52] U.S. Cl. .................. 324/142; 307/66; 429/62
[58] Field of Search ............ 324/142, 113, 116, 157; 307/66; 365/229; 429/62

[56] References Cited

U.S. PATENT DOCUMENTS

| | | | |
|---|---|---|---|
| 1,266,780 | 5/1918 | Edison | 429/62 |
| 4,197,582 | 4/1980 | Johnston et al. | 324/142 |
| 4,713,609 | 12/1987 | Losapio et al. | 307/66 |
| 4,913,854 | 4/1990 | Baer | 429/62 |

Primary Examiner—Ernest F. Karlsen
Attorney, Agent, or Firm—Marvin Snyder; James C. Davis, Jr.

[57] ABSTRACT

An electrical-energy-supplying device having an extended storage life includes a thermoelectric (TE) working module which has a hot junction and a cold junction. A storage battery for supplying electrical energy is thermally connected to the cold junction to transfer heat from the battery to the hot junction of the TE module when a voltage of proper polarity and magnitude is applied to the TE module. A thermal sensor is thermally connected to the battery and electrically connected to a cooling control circuit to cause application of the voltage to the TE module when the battery temperature exceeds a selected temperature level. The storage life of the battery may be extended by maintaining the battery temperature below the selected temperature level.

10 Claims, 2 Drawing Sheets

ELECTRICAL-ENERGY-SUPPLYING DEVICE HAVING AN EXTENDED STORAGE LIFE

BACKGROUND OF THE INVENTION

The present invention relates to battery backup power systems and, more particularly, to a thermoelectric cooling device for extending the life of a battery backup power system used for powering electronic components when utility line power is interrupted or unavailable.

Use of a battery or an electrolytic-type device to provide backup power to electronic equipment during a power outage is known in the art. One such application is with time of use (TOU) watt-hour meters. TOU watt-hour meters permit electric utilities to apply complex rate structures to their customers. TOU watt-hour meters typically sample a customer's energy usage at selected times and record the kilowatts used with the corresponding time of use; thus, different billing rates can be applied for different times of the day, days of the week and even during certain times of the year, such as holidays and different seasons. These meters typically utilize an application specific integrated circuit (ASIC), microprocessor or the like for recording the kilowatts and the time of use. The ASIC will also include a clock for measuring time and maintaining calendar information. The ASIC and clock are powered by the utility line power under normal operating conditions, but these type meters also usually have a battery for backup ASIC power when utility line power is interrupted. The battery will maintain operation of the ASIC clock during power outages to prevent the need for a maintenance visit by utility personnel to reset the system clock and correct for the period of power outage after power is restored.

A lithium-type battery may be used in TOU watt-hour meters to maintain the ASIC clock during power outages, but these type batteries have a limited shelf life and must be replaced about every five years at a cost of about $10 per battery. Maintaining reliable battery backup for TOU watt-hour meters is therefore a considerable burden for utility companies when considering the number of units in the field and the logistics and record-keeping requirements. To meet the needs of most utility companies which use TOU watt-hour meters, a desired backup battery power system will: have a shelf life in excess of 20 years; and provide approximately 2-5 volts and 1-10 μamps for more than about 30 days. Solid state lithium iodine-type batteries, such as those used in heart pacemakers and the like, typically have a life in excess of about 20 years when operated at body temperature, i.e., about 37° C. However, the life of these pacemaker-type batteries decreases and the current and voltage levels are unreliable when the batteries are stored at higher temperatures. TOU watt-hour meters can be exposed to temperatures as high as about 85° C. for long periods in some climates; under such conditions, the capacity of the battery can decrease by about 80 percent in five years.

It is accordingly a primary object of the present invention to provide a novel cooling device for cooling a temperature-sensitive component.

It is another object of the present invention to provide a novel backup power supply device for a TOU watt-hour meter, which is not subject to the foregoing disadvantages.

It is a further object of the present invention to provide a device for cooling the backup battery for a TOU watt-hour meter to extend the useful life of the backup battery.

These and other objects of the invention, together with the features and advantages thereof, will become apparent from the following detailed specification when read with the accompanying drawings in which like reference numerals refer to like elements

SUMMARY OF THE INVENTION

In accordance with the present invention, an electrical-energy-supplying device having an extended storage life, which may be used as a battery backup power system when utility power is interrupted, includes a thermoelectric (TE) working module which has a hot junction and a cold junction. A storage battery means for supplying electrical energy is thermally connected to the cold junction and a cooling control circuit is connected between the TE working module and the utility power. The cooling control circuit will apply a voltage of a selected magnitude and polarity to the TE working module to cause heat transfer from the storage battery means to the hot junction when the storage battery temperature exceeds a selected level, preferably between about 20° C.–25° C. The battery and at least a top portion of the cold junction in contact with the battery may be housed in an insulated enclosure to improve cooling efficiency; the skin of the enclosure may be fabricated from a heat and light reflective-type material.

In accordance with an embodiment of the present invention, the electrical-energy-supplying device may be mounted in the housing of a TOU watt-hour meter to supply backup power to a data means, such as an ASIC or the like, to cause the data means to maintain clock and calendar information when utility power is interrupted.

DETAILED DESCRIPTION OF THE PREFERRED EMBODIMENT

Figure 1:
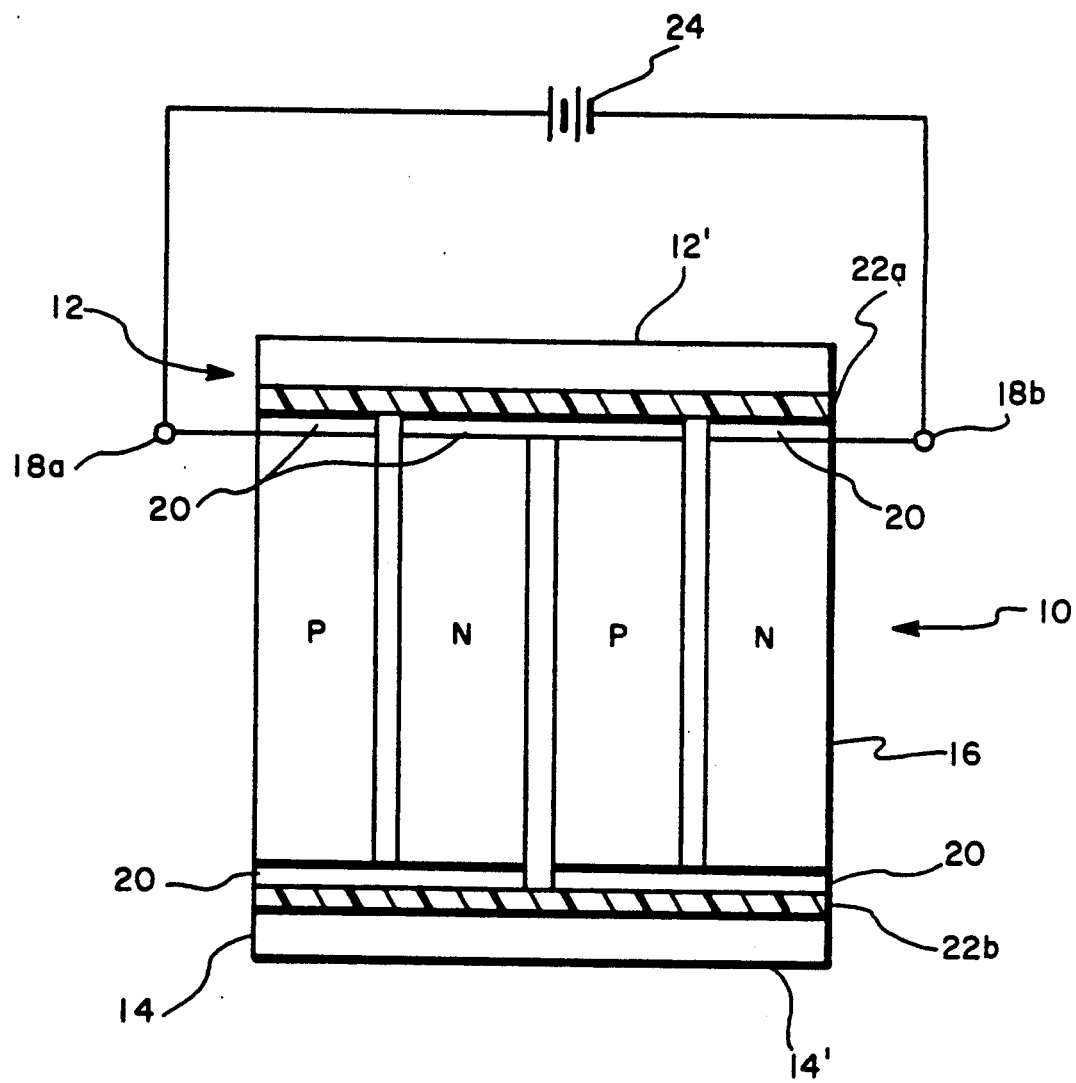
FIG. 1 is a schematic diagram of a thermoelectric working module.

The use of thermoelectric (TE) working modules for cooling (and heating) is known in the art (*Modern Thermo-electrics*, D. M. Rowe and C. M. Bhandari, Reston Publishing Co., 1983); a two-couple single-stage TE module 10 is shown in FIG. 1. TE module 10 includes a cold junction 12 and a hot junction 14 with multiple arms 16 of thermoelectric material connected therebetween in thermal parallel. The thermoelectric material may be bismuth telluride or an alloy of bismuth, tellurium, selenium, antimony or similar type materials. Arms 16 are alternately doped to have P or N type conductivity. Arms 16 are electrically connected in series between electrical input terminals 18a and 18b by connecting straps 20, which are fabricated from a high electrically and thermally conductive material such as copper, tungsten, nickel, stainless steel or the like and arms 16 are thermally connected in parallel between cold junction 12 and hot junction 14 by connection buses 22a and 22b, which are fabricated of an electrical insulator with good thermal conductivity such as alumina (Al₂O₃) or the like. Pads 12' and 14', fabricated from solder-type material or the like, may be respectively attached to buses 22a and 22b to facilitate mechanical attachment of TE module 10 to a temperature-sensitive component and/or a heat sink. In operation, a DC voltage source 24, of proper polarity and magnitude, applied to input terminals 18a and 18b will cause heat transfer from cold junction 12 through arms 16 to hot junction 14 to provide cooling at cold junction 12. Cold junction 12 may be thermally connected to a temperature-sensitive component (not shown) by pad 12' to cool the component. A reversal of polarity will cause heat transfer in the alternate direction (i.e. from hot junction 14 to cold junction 12) to provide heating.

Figure 2:
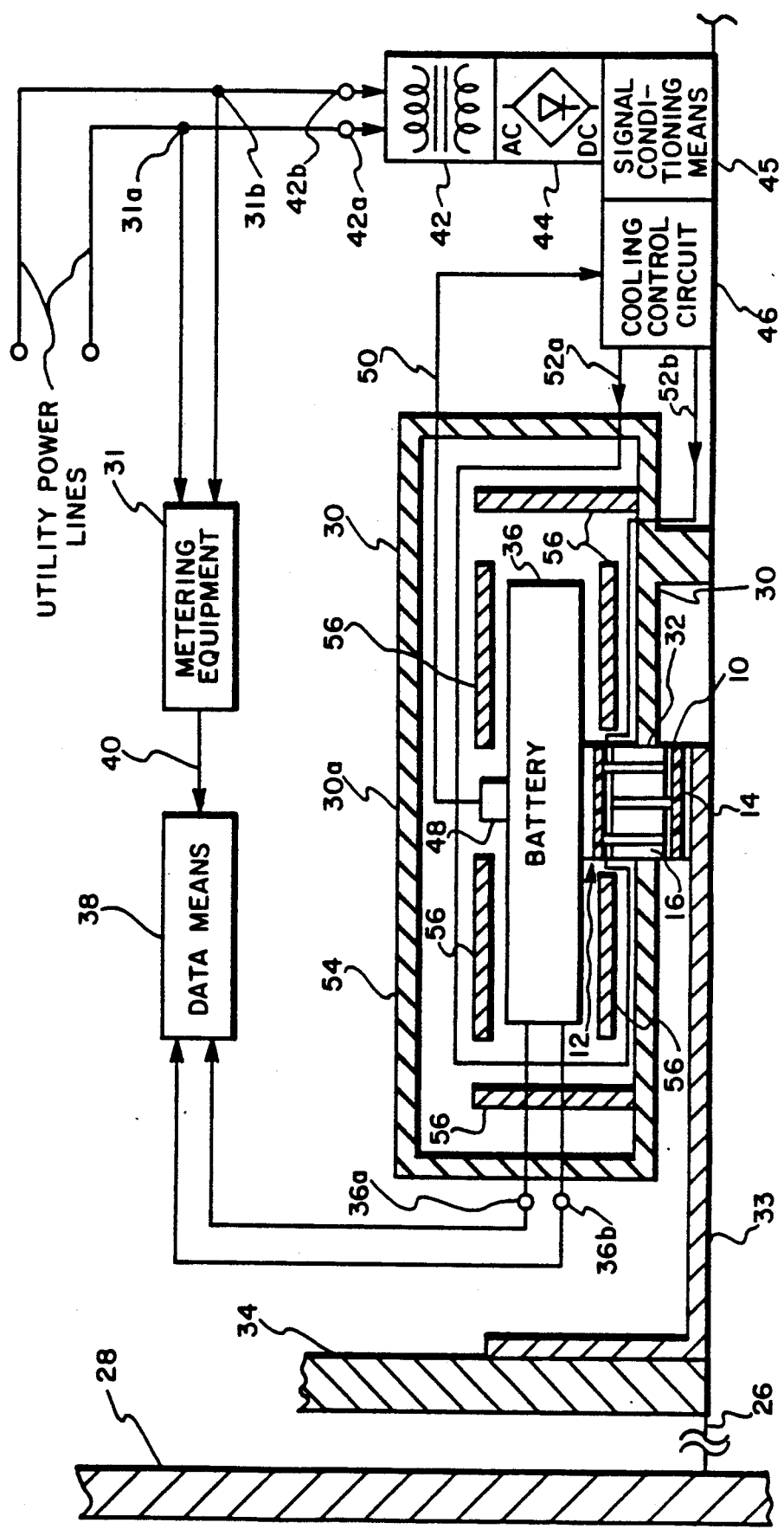
FIG. 2 is a side elevation view of the electrical-energy-supplying device in accordance with the present invention.

Referring to FIG. 2, a TOU watt-hour meter housing 26 is typically mounted on an exterior wall 28 of a structure to which the utility company is supplying electrical power. In accordance with the present invention, an insulated enclosure 30 is mounted in meter housing 26 at an appropriate location therein where enclosure 30 will not interfere with the operation of the metering equipment 31 (shown in block diagram form). Insulated enclosure 30 is preferably constructed with at least an exterior surface 30a of a light and heat reflective material so that sunlight will not appreciably heat the components housed within. A thermoelectric (TE) working module 10 may be mounted within enclosure 30 and includes a cold junction 12, a hot junction 14, and a plurality of thermoelectric material arms 16 thermally connected in parallel between the hot and cold junctions. TE module 10 may also be mounted within meter housing 26, substantially external to enclosure 30, but with at least a portion of cold junction 12 extending into enclosure 30 through an opening 32 formed through the bottom of enclosure 30 (FIG. 2).

A copper or aluminum strap 33 or the like is preferably thermally connected between hot junction 14 and a stationary metal plate 34 of the meter equipment, which acts as a heat sink to dissipate heat transferred by strap 33 from hot junction 14 to plate 34. A heat sink (not shown) may alternatively be integrally formed with hot junction 14, which extends externally from insulated enclosure 30 and may also extend externally from meter housing 26 to permit heat transferred to hot junction 14 to be dissipated into the atmosphere.

A battery 36, such as a lithium type battery, "pacemaker-type" battery or the like, is contained within insulated enclosure 30 and is thermally connected to cold junction 12 extending through enclosure opening 32. Battery 36 should typically have a casing of heat conductive material to facilitate cooling of the battery as a whole. Battery 36 includes battery terminals 36a and 36b for electrically connecting battery 36 to a data means 38, such as an application specific integrated circuit (ASIC), microprocessor or the like, of the TOU watt-hour meter. Battery 36 will supply electrical power to a clock, integrally formed with data means 38, when utility line power is interrupted. Data means 38 is electrically coupled to metering equipment 31 by a signal transmission path 40 over which data means 38 receives electrical usage information, which data means 38 stores with time of use information. Metering equipment 31 has terminals 31a and 31b for connecting the metering equipment to the utility power lines.

A transformer means 42 and a rectifier means 44 are mounted in meter housing 26, preferably outside of insulated enclosure 30, to provide a DC voltage to TE working module 10 when battery cooling is required.

The DC voltage required will be a function of the capacity of TE module 10 and the cooling power desired. Transformer means 42 has input terminals 42a and 42b for connecting the transformer primary windings to the utility line power. The secondary windings of transformer means 42 are connected to rectifier means 44. Signal conditioning means 45, such as a capacitive or inductive filter or the like, may be coupled to rectifier means 44 for smoothing the DC signal resulting from the rectified AC signal because the AC harmonics that appear in the DC signal may have some effect on the cooling efficiency of the TE working module. The reduction in cooling efficiency is proportional to the harmonic ripple squared ($R^2$); thus, a harmonic ripple having amplitude that is about 20 percent of the magnitude of the DC signal will cause a reduction in efficiency of about 4 percent. Rectifier means 44 may be a regular rectifier, a Schottky rectifier, or preferably a metal-oxide-semiconductor (MOS) device, such as a power MOS field effect transistor (MOSFET) which has the advantage of having a low forward on resistance so that very little power is lost in the MOSFET when it is in a conductive state.

A cooling control circuit means 46 is also mounted in meter housing 26, preferably outside of insulated enclosure 30, and is connected in an electrical path between the utility line power and TE working module 10; cooling control circuit means 46 controls the application of the DC voltage from signal conditioning means 45 to TE module 10. Control circuit means 46 includes a thermal sensor 48, thermally connected to battery 36 for sensing the temperature of battery 36. Cooling control circuit means 46 may include an electrically controlled switch (not shown), such as a field effect transistor or the like, and thermal sensor 48 may be a thermistor, thermocouple or similar temperature-sensitive device. Thermal sensor 48 is connected to cooling control circuit means 46 by signal transmission path 50, which transfers electrical signals from sensor 48 to cooling control circuit means 46. When sensor 48 detects a battery temperature in excess of a selected temperature (preferably between about 20°–25° C.), cooling control circuit means 46 will become conductive to apply DC voltage of proper polarity and magnitude to TE module 10 to cause TE module 10 to transfer heat from battery 36 to hot junction 14 for dissipation via strap 33 and heat sink plate 34. It should be noted that while cooling control circuit 46 is shown to be electrically connected to cold junction 12 by conductors 52a and 52b, cooling control circuit 46 could equally be connected to apply a DC voltage of opposite polarity to hot junction 14 to cause heat transfer from battery 36 to hot junction 14. TE module 10 will only cool battery 36 when utility line power is uninterrupted but since power outages are usually of a short duration, any short term heating of the battery above the selected temperature is not expected to appreciably shorten the battery's life. While FIG. 2 shows cooling control circuit means 46 connected between rectifier means 44 and TE module 10, cooling control circuit means 46 could equally be designed for connection at any location between the utility line power and TE module 10 and transformer means 42 and rectifier means 44 could be rearranged accordingly.

The interior volume 54 of insulated enclosure 30 may be packed with a foam-type insulation, such as styrofoam or the like, to reduce heating from external conditions, such as sunlight or the like, and to improve cooling efficiency. A less economical but probably more effective insulating technique is to evacuate enclosure 30 to form a vacuum and mount reflective heat shields 56 within the enclosure. Reflective heat shields 56 will retard the radiative transport of heat and the vacuum will retard the convective and conductive transport of heat to the battery/TE module combination. In this environment, TE module 10 can be selected to have a cooling capacity which will maintain the temperature of the battery at about 20° C. This battery temperature is expected to provide a battery life in excess of about 20 years. Preferably, only the components that need to be cooled are contained inside enclosure 30 to minimize the size of the enclosure and improve cooling efficiency.

It will be readily understood by those skilled in the art that the present invention is not limited to the specific embodiments described and illustrated herein. Different embodiments and adaptations besides those shown herein and described, as well as many variations, modifications and equivalent arrangements will now be apparent or will be reasonably suggested by the foregoing specification and drawings, without departing from the substance or scope of the invention. While the present invention has been described herein in detail in relation to its preferred embodiments, it is to be understood that this disclosure is only illustrative and exemplary of the present invention and is made merely for purposes of providing a full and enabling disclosure of the invention. Accordingly, it is intended that the invention be limited only by the spirit and scope of the claims appended hereto.

What is claimed is:

1. A TOU watt-hour meter for measuring electrical energy usage from a utility line, comprising:
   metering means, having at least two terminals for connecting to the utility line, for measuring electrical energy usage;
   data means, coupled to said metering means, for recording electrical energy usage and time of use information;
   battery means for supplying electrical energy to said data means to maintain accurate time information if the utility line energy is interrupted;
   a thermoelectric working module having a cold junction thermally connected to said battery means, and a hot junction thermally connected for heat dissipation away from said battery means; and
   cooling control means for causing said thermoelectric working module to transfer heat energy away from said battery means when said battery means exceeds a selected temperature.

2. The device of claim 1 further comprising an insulated enclosure for housing said battery means with at least a portion of said cold junction extending into said enclosure.

3. The device of claim 2 wherein said insulated enclosure has an outer surface of heat and light reflective material.

4. The device of claim 2 wherein said insulated enclosure is substantially filled with a foam-type insulation material.

5. The device of claim 2 wherein said insulated enclosure is evacuated and includes a plurality of heat reflective shields mounted within said enclosure.

6. The device of claim 1 further comprising heat sink means for dissipating heat transferred to said hot junction.

7. The device of claim 6, wherein said heat sink means includes: a thermally conductive plate; and a strap of thermally conductive material thermally connected to transfer heat away from said battery means to said plate for dissipation.

8. The device of claim 1, wherein said cooling control means comprises:
   switching means for connecting the voltage to said thermoelectric module to cause cooling of said battery means; and
   thermal sensor means, thermally connected to said battery means and electrically connected to said switching means, for generating electrical signals to cause said switching means to connect the voltage to said thermoelectric module when said battery means exceeds said selected temperature.

9. The device of claim 1, further comprising:
   a transformer having a secondary winding and a primary winding for connection to an AC line voltage; and
   rectifier means, connected in an electrical path between said transformer secondary winding and said thermoelectric working module, for providing a DC voltage for application by said cooling control means to said thermoelectric working module.

10. The device of claim 9, further comprising signal conditioning means for reducing the harmonic ripple in a rectified AC signal connected between said rectifier means and said thermoelectric working module.

* * * * *